US008246462B1

(12) United States Patent
Tran et al.

(10) Patent No.: US 8,246,462 B1
(45) Date of Patent: Aug. 21, 2012

(54) HALL-EFFECT FINGER-MOUNTED COMPUTER INPUT DEVICE

(75) Inventors: Nghia Tran, San Diego, CA (US); Michael R. Blackburn, Encinitas, CA (US); Hoa V. Phan, Escondido, CA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 362 days.

(21) Appl. No.: 12/476,301

(22) Filed: Jun. 2, 2009

(51) Int. Cl.
*A63F 9/24* (2006.01)
*H01L 43/06* (2006.01)

(52) U.S. Cl. ............. 463/37; 463/31; 463/32; 463/33; 463/34; 463/35; 463/36; 463/38; 463/39; 345/156; 345/158; 345/181

(58) Field of Classification Search .............. 463/37; 345/158, 181
See application file for complete search history.

(56) References Cited

U.S. PATENT DOCUMENTS

| | | | | |
|---|---|---|---|---|
| 6,304,840 B1 * | 10/2001 | Vance et al. | ............... | 703/21 |
| 6,380,923 B1 * | 4/2002 | Fukumoto et al. | ............ | 345/156 |
| 6,909,420 B1 * | 6/2005 | Nicolas et al. | ................ | 345/156 |
| 7,038,658 B2 * | 5/2006 | Seki et al. | ...................... | 345/156 |
| 7,850,514 B2 * | 12/2010 | Weber | .............................. | 463/2 |
| 2005/0207599 A1 * | 9/2005 | Fukumoto et al. | ............. | 381/151 |
| 2007/0096723 A1 * | 5/2007 | Rieger et al. | ............. | 324/207.24 |
| 2007/0182545 A1 * | 8/2007 | Baum et al. | .............. | 340/539.11 |
| 2007/0282378 A1 * | 12/2007 | Huang et al. | ...................... | 607/2 |
| 2008/0088303 A1 * | 4/2008 | Englert | ......................... | 324/226 |
| 2008/0165163 A1 * | 7/2008 | Bathiche | ....................... | 345/179 |
| 2009/0112601 A1 * | 4/2009 | Fullmer | ........................ | 704/271 |

\* cited by examiner

*Primary Examiner* — N Drew Richards
*Assistant Examiner* — John P Dulka
(74) *Attorney, Agent, or Firm* — Arthur K. Samora; Kyle Eppele

(57) ABSTRACT

A Hall-effect system for providing inputs into a processor includes at least one magnet for establishing a magnetic field, a remote sensor unit and a receive station. The magnet is sized and adapted to be worn on a user's finger, while the remote sensor unit is adapted to be worn on a user's thumb. The remote sensor unit includes a Hall-effect sensor that senses changes in the magnetic field due to the motion of the magnet relative to the Hall-effect sensor. The Hall-effect sensor detects the magnetic field changes, and the remote sensor unit generates a sensor output corresponding to the magnetic field changes. The receive station is connected to the processor. The receive station receives the output from the remote sensor unit and converts the sensor output into an input for the processor.

4 Claims, 2 Drawing Sheets

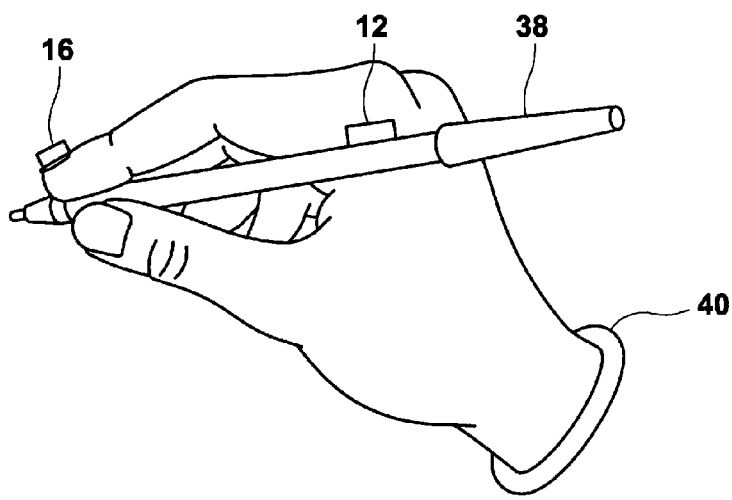
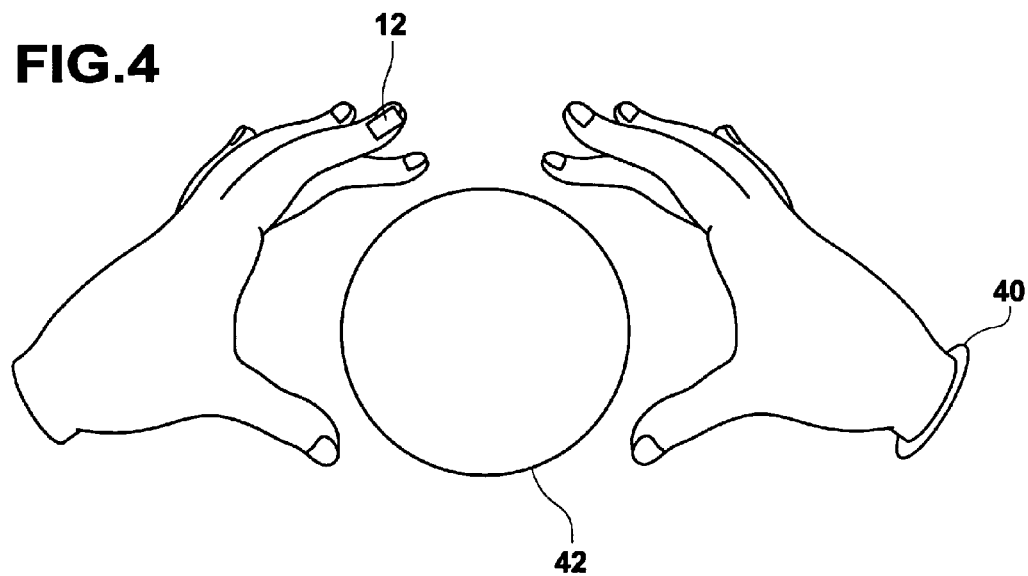

HALL-EFFECT FINGER-MOUNTED COMPUTER INPUT DEVICE

FEDERALLY-SPONSORED RESEARCH AND DEVELOPMENT

This invention (Navy Case No. 099530) is assigned to the United States Government and is available for licensing for commercial purposes. Licensing and technical inquires may be directed to the Office of Research and Technical Applications, Space and Naval Warfare Systems Center, Pacific, Code 72120, San Diego, Calif. 92152; voice (619) 553-2778; email T2@spawar.navy.mil.

FIELD OF THE INVENTION

The present invention pertains generally to a system and method for providing inputs into a processor for a personal computer or for a video game controller. More specifically, the present invention pertains to a system that takes advantage of the Hall effect in a manner which obviates the need for moving parts for the system as it provides inputs into the processor.

BACKGROUND OF THE INVENTION

The Hall effect is the production of a potential difference (the Hall voltage) across an electrical conductor, transverse to an electric current in the conductor and a magnetic field perpendicular to the current. Edwin Hall discovered this effect in 1879. When appropriately encapsulated in protective materials, Hall-effect devices are immune to dust, dirt, mud, and water. These characteristics can make Hall-effect devices better for position sensing than alternative means such as optical and electromechanical sensing. For these reasons, Hall-effect devices can also offer enhanced reliability when functioning as motion sensors and motion limit switches in extreme environments. Further, since there are no moving parts involved within the sensor or magnet, the typical life expectancy of Hall-effect device is improved, when compared to traditional electromechanical switches.

On the other hand, Hall-effect devices produce a very low signal level and typically require amplification. While suitable for laboratory instruments, the vacuum tube amplifiers available in the first half of the 20th century were too expensive, power consuming, and unreliable for everyday applications. It was only with the development of the low cost integrated circuit that the Hall-effect sensor became suitable for mass application.

One application where a Hall-effect sensor with increased reliability and service life could be used is as an input to a game controller, personal computer, or any other device with a processor. Many conventional computer games use a joystick type of controller as an input for playing games on the computer. This tool often requires bimanual operation. Similarly, the conventional mouse is the current pointing and selection device for most desktop personal computer systems, while the mouse pad and associated keys serve a similar function for laptops. Both the controller and the mouse require the user to physically reach for and manipulate a tool. These requirements limit the user's workspace and distract to some degree the user's attention. Additionally, both the joystick and mouse have moving parts, which inevitably wear down and make the device inoperative, often at very inopportune times.

In view of the above, it is an object of the present invention to provide a Hall-effect finger-mounted computer input device that provides functionality that is similar to the functionality of a conventional point-and-click mouse point or joystick controller. Another object of the present invention is to provide Hall-effect finger-mounted computer input devices that are compatible with existing personal computers and game computers. Yet another object of the present invention is to provide a Hall-effect finger-mounted computer input device, which reduces demands on user attention and effort and increases user comfort while providing inputs to a computer or processor. Still another object of the present invention is to provide a Hall-effect finger-mounted computer input device that does not require any moving parts to provide inputs into a computer. Another object of the present invention is to provide the Hall-effect finger-mounted computer input device that functions as a universal controller for a variety of computer aided devices without additional encumbrance upon the user.

SUMMARY OF THE INVENTION

A Hall-effect system for providing inputs into a processor for a personal computer, and methods for use of the system in accordance with several embodiments of the invention, includes at least one magnet for establishing a magnetic field and a remote sensor unit. The magnet is sized and adapted to be worn on a user's finger, while the remote sensor unit is sized and adapted to be worn on a user's thumb. Alternatively, the magnet can be mounted to a hand tool such as a writing utensil and the remote sensor unit can be sized and adapted to be worn on a user's finger, or vice versa.

The remote sensor unit includes a Hall-effect sensor that senses changes in the magnetic field due to relative motion of the magnet with respect to the Hall-effect sensor. The relative motion of the magnet occurs in three dimensions when the user manipulates the thumb and finger, or when the user manipulates the finger and tool in several alternative embodiments. The Hall-effect sensor detects the magnetic field changes, and the remote sensor unit generates a sensor output corresponding to the magnetic field changes.

The Hall-effect system can further include a receive station for receiving the sensor output from the remote sensor unit. The receive station and remote sensor may be hardwired; alternatively, the receive station and remote sensor unit may be connected and communicate via a wireless radio frequency (RF) communications link. The receive station is also connected to the processor to be manipulated; it receives the remote sensor outputs and converts the sensor output into a processor input.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which:

FIG. 3 is a drawing of an alternative embodiment of the magnet and remote sensor unit of the system of FIG. 1; and, FIG. 4 is a drawing of another alternative embodiment of the magnet and remote sensor unit of the system of FIG. 1.

DETAILED DESCRIPTION OF THE EMBODIMENTS

Figure 1:
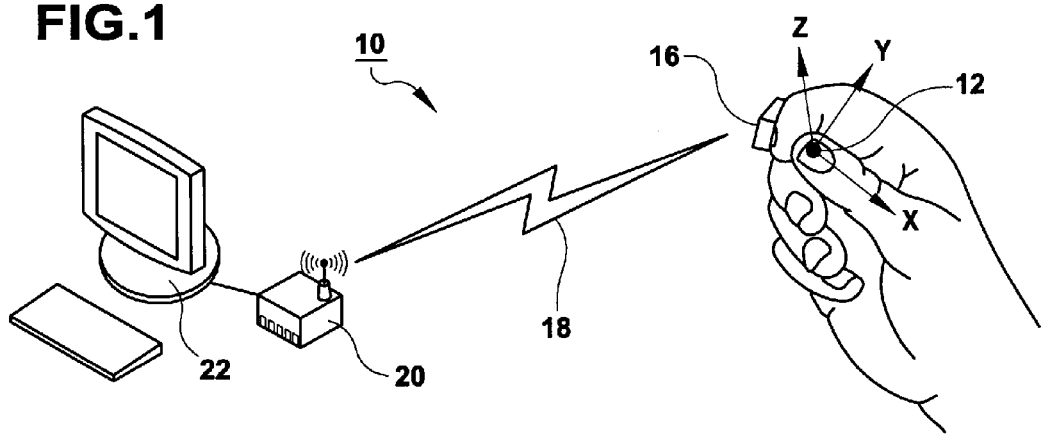
FIG. 1 is a drawing of a Hall-effect finger-mounted computer input system according to several embodiments of the present invention.
Figure 2:
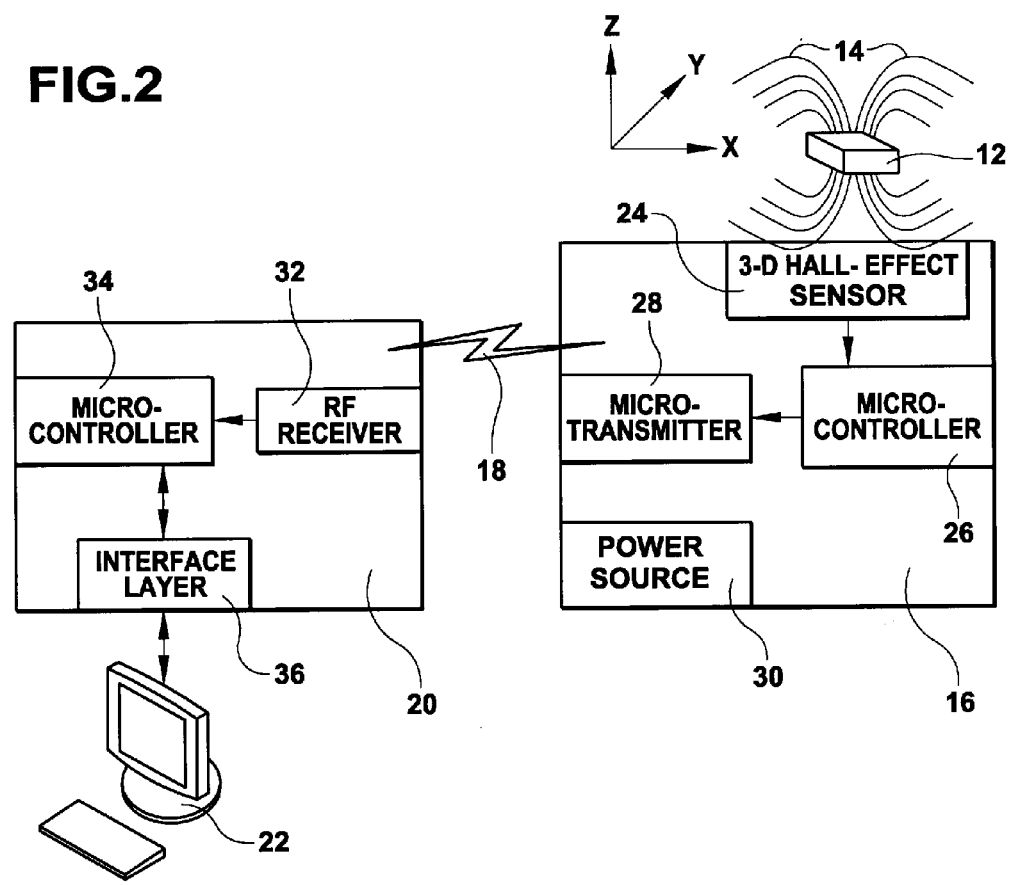
FIG. 2 is a diagram of the system of FIG. 1, which illustrates the component parts of the remote sensor unit and receive station in greater detail.

Referring now to the Figures, the Hall-effect finger-mounted computer input device according to several embodiments of the present invention is shown and is generally designated by reference character 10. In brief overview, and as shown in FIG. 1, the system 10 includes a magnet 12 that can be affixed to the user's thumb in order to function as a local source of a magnetic field 14 (magnetic field 14 is shown in FIG. 2). The system can further include a remote sensor unit 16 that can be attached to the user's finger, as shown in FIG. 1. With this configuration, when the thumb and index fingers move in relative spatial opposition in the X, Y, and/or Z dimensions, the change in the magnetic field on those dimensions is detected by a three-dimensional (3-D) Hall-effect sensor located in remote sensor unit 16. The output of the Hall-effect sensor is digitized at the remote sensor unit and can be sent by wirelessly local radio frequency (RF) link 18 to a receive station 20 (remote sensor 16 and receive station 20 could also be hardwired), where the data are processed and converted into conventional mouse pointer control commands that are input into a processor 22 for a personal computer, video game controller, or other device that uses a processor. The manner in which the above process is accomplished is described more fully below.

In FIG. 2, the component parts of remote sensor unit 16 and receive station 20 are shown in greater detail. As mentioned above, a permanent magnet 14 that is sized and adapted to be worn on the user's thumb serves as the source of a magnetic field 14. Remote sensor unit 16 includes a Hall-effect sensor 24 that senses 3-D changes in magnetic field 14 due to relative motion between the sensor 24 and magnet 14, which is due to relative motion between the user's thumb and forefinger. A microcontroller 26 reads magnetic field data from 3D Hall-effect sensor 24 and transmits the data to the receive station unit 20 via an RF transmitter 28. To do this, microprocessor 26 receives analog inputs from Hall-effect sensor 24 and converts the analog input to a digital signal. In this manner, the microcontroller 26 also defines transmission data protocol for the remote sensor unit 16. The power supply for the remote sensor unit includes a rechargeable power source 30. The microcontroller 26 also monitors the system voltage level and controls the power source charging process. Alternatively, disposable batteries such as those used in watches or hearing aids could also be used as the power source.

At the receive station 20, an RF receiver 32 receives data from the remote sensor unit 16 and passes the data on to receive station microcontroller 34, where the data are processed and converted into conventional X, Y, and Z dimensions and selection commands for a mouse application into processor 22 via interface layer 36. The interface layer 36 provides proper plug-in features to processor in personal computers, video game controllers, command/control stations, and/or media systems. The power supply (not shown) for receive station 20 can be an external power source, or power can be provided to the receive station from the processor device that it is providing input to, when receive station 20 is connected to processor 22 via a cable connection for operation.

In several other embodiments of the invention, the magnet 12 may be located on the body of a tool, such as pen or other writing utensil 38, while the remote sensor unit 16 is located on the user's forefinger, or vice versa. In one example of this embodiment, shown in FIG. 3, the user can generate relative motion between the magnet 12 and remote sensor unit 16 by moving the finger relative to the utensil 38, i.e., sliding the finger across the pen and/or tapping the pen as the application may require. Once this occurs, the system 10 operates as described above. The pen may be disposable at minimal expense; or, when remote sensor unit 16 is attached to utensil 38, the attachment may be temporary and the sensor may be removed before disposal of the tool. If the remote sensor unit has a power source that can be selectively operated, twisting or clicking of the utensil can be accomplished to selectively activate power source 30 for remote sensor unit 16. In other alternative embodiments of the present invention, and as shown in FIG. 3, either the magnet 12 or the remote sensor unit 16 may be incorporated into an item that is worn, such as bracelet 40. This configuration could offer further advantages, in that the user's fingers have greater freedom of motion than if the user was holding a pen, small tool, or similar utensil.

FIG. 4 shows yet another alternative embodiment of the present invention. As shown in FIG. 4, either of the remote sensor unit 16 or the magnet 12 could be incorporated into ball 42, in a "crystal ball" type of configuration, and the other of magnet 12 or remote sensor unit 16 could be attached to the user's finger on one hand, or incorporated into a bracelet 40 that is worn by the user. In still other embodiments of the present invention, either magnets 12 or remote sensor units 16 could be worn on both hands to establish inputs in six degrees of freedom. The user could manipulate the system 10 by waving both hands in different directions around ball 42.

For operation of the system 10, the remote sensor unit 16 can be selectively activated (if power source 30 can be selectively activated). Once the remote sensing unit is activated, signal processing algorithms embedded in and running on the microcontroller 26 and receive microcontroller 34 automatically calibrate the Hall-effect input upon startup, using technology that is compatible with existing commercial user input/output pointing and selecting devices. When system operates as a computer mouse, the user slides his fingers together relatively to move a computer cursor or arrow on the X and Y dimensions of a computer display, and taps/presses the fingers in Z dimension together to make selections (i.e., to "mouse click" the system).

As the user's thumb and index fingers move in relative spatial opposition in the X, Y, and/or Z dimensions, the changes in the magnetic field on those dimensions is detected by the three-dimensional (3-D) Hall-effect sensor 24 located in remote sensor unit 16. The analog output of the Hall-effect sensor 24 is digitized at microprocessor 26 for remote sensor unit 16. Microprocessor converts the analog input from the sensor 24 into a digital signal in order to interpret/translate the change/motion in position information for any particular application. Remote sensor unit 16 then sends the digital information as an RF signal to receive station 20, or via a cable connection if remote sensor unit 16 and receive station 20 are hardwired.

The receive station 20 converts sensor digitized data received from remote sensor unit and interprets spatial changes in flux density on X, Y, and Z axes into mouse commands. Receive station 20 relays those commands to processor 22 via interface layer 36, which can be a universal serial bus (USB) and/or PLAYSTATION® 2 (PS2) interface layer to the processor. For a 3-D application, such as a joystick or a video game controller, the Z axis information can be used directly. In this manner, the system 10 of the present invention can be used as a universal controller to provide any inputs into any system that incorporates a processor, such as personal computer, video game controllers, electromechanical system, or weapon system. All that is required is that the system to be controlled be capable of providing feedback to the user. The feedback could be the screen of a personal computer, video game, light emitting diode's (LED's) on a system, or even the motion of an object (for example, if the user is using the system 10 of the present invention 10 to visually monitor the motions of a controlled robot).

In several embodiments of the present invention, the point of fixation of the Hall-effect sensor (remote sensor unit 16) to the finger and magnet 12 to the thumb can be chosen for minimal interference with the user's other digital and manual activities, such as typing or writing. The sensor and magnet can thus be worn comfortably throughout the workday. At the same time, the distance between remote sensor unit 16 and magnet 12 must be close enough so that Hall-effect sensor 24 can detect the magnetic field 14 emitted by magnet 12, as well as any changes thereto. Alternatively, magnetic field 14 must be strong enough for use in conjunction with Hall-effect sensor 24 in the manner prescribed above. For several embodiments of the invention, where the remote sensor unit 16 and magnet 12 are placed on the thumb and finger, a MLX903333 or AMI602 TRIAXIS® sensor can be used for the Hall-effect sensor, in conjunction with a magnet that emits a magnetic field having a magnetic field strength of twenty to one hundred fifty milliTeslas (20-150 mT). It should be appreciated that other Hall-effect sensors with different sensitivities and other magnets with different field strengths could also be used for different applications, provided the sensitivity of the Hall-effect sensor is compatible with the strength of the magnetic field.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein.

All systems and methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

The invention claimed is:

1. A device for providing inputs to a processor comprising:
at least one magnet adapted to be worn at the extremity of one of a user's finger or a user's thumb, said magnet for establishing a magnetic field;
a remote sensor unit adapted to be worn at the extremity of the other of said user's finger or said user's thumb, said remote sensor unit including a Hall-effect sensor for sensing changes in said magnetic field due to motion of said magnet as said finger and
said thumb are moved while in direct contact with each other, said remote sensor unit generating a sensor output corresponding to said changes in said magnetic field;
said remote sensor unit further including a microtransmitter and a microcontroller incorporated therein, and,
a receive station connected to said processor, said receive station receiving said sensor output, and converting said sensor output into an input for said processor during operation of said device.

2. The device of claim 1 further comprising a power source incorporated into said remote sensor unit for selective activation of said Hall-effect sensor.

3. A method for providing inputs to a processor, said method comprising the steps of:
A) establishing a magnetic field with a magnet that is adapted to be worn at the extremity of one of a user's finger or a user's thumb;
B) sensing Hall-effect changes in said magnetic field due to motion of said magnet with a remote sensor unit, said remote sensor unit being adapted to be worn at the extremity of the other said user's finger or said user's thumb;
C) generating a sensor output with said remote sensor unit by rubbing said thumb and said finger together, said sensor output corresponding to said changes in said magnetic field said generating step accomplished using a microcontroller incorporated within said remote sensing unit;
D) transmitting said sensor output to a receive station that is connected to said processor, said transmitting step accomplished using a microtransmitter incorporated within said remote sensing unit; and,
E) converting said sensor output into an input for said processor, said step E) being accomplished simultaneously with said step C) and said step D).

4. The method of claim 3, further comprising the step of:
F) incorporating a power source into said remote sensor unit for selective accomplishment of step B) and step C).

* * * * *